(12) United States Patent
Tahata et al.

(10) Patent No.: US 11,031,882 B2
(45) Date of Patent: Jun. 8, 2021

(54) MODULAR MULTILEVEL CONVERTER HAVING CAPACITOR DEGRADATION DETERMINATION

(71) Applicant: Mitsubishi Electric Corporation, Tokyo (JP)

(72) Inventors: Kazuyori Tahata, Tokyo (JP); Yoshiyuki Kono, Tokyo (JP); Kenichi Kuroda, Tokyo (JP); Shuhei Fujiwara, Tokyo (JP); Ryosuke Uda, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 27 days.

(21) Appl. No.: 16/500,143

(22) PCT Filed: May 26, 2017

(86) PCT No.: PCT/JP2017/019742
§ 371 (c)(1),
(2) Date: Oct. 2, 2019

(87) PCT Pub. No.: WO2018/216208
PCT Pub. Date: Nov. 29, 2018

(65) Prior Publication Data
US 2021/0099102 A1 Apr. 1, 2021

(51) Int. Cl.
*H02M 7/483* (2007.01)
*H02M 7/81* (2006.01)
(Continued)

(52) U.S. Cl.
CPC ............. *H02M 7/81* (2013.01); *H02M 1/088* (2013.01); *H02M 7/483* (2013.01); *H02M 7/797* (2013.01);
(Continued)

(58) Field of Classification Search
CPC ......... H02M 7/483; H02M 2007/4835; H02M 7/53871; H02M 2001/0003; H02M 1/36
See application file for complete search history.

(56) References Cited

U.S. PATENT DOCUMENTS

| 5,804,973 A | 9/1998 | Shinohara et al. |
| 2010/0321038 A1 | 12/2010 | Dommaschk et al. |

(Continued)

FOREIGN PATENT DOCUMENTS

| EP | 2887526 A1 | 6/2015 |
| JP | H02051365 A | 2/1990 |

(Continued)

OTHER PUBLICATIONS

International Search Report (PCT/ISA/210), with translation, and Written Opinion. (PCT/ISA/237) dated Jun. 27, 2017, by the Japan Patent Office as the International Searching Authority for International Application No. PCT/JP2017/019742.

(Continued)

*Primary Examiner* — Alex Torres-Rivera
(74) *Attorney, Agent, or Firm* — Buchanan Ingersoll & Rooney PC

(57) ABSTRACT

A power conversion device includes power conversion circuitry including a plurality of submodules connected in series to each other. The power conversion device further includes: a signal reception unit configured to receive a signal representing a voltage of a capacitor in each of the submodules; a time calculation unit configured to calculate at least one of a charging time of the capacitor and a discharging time of the capacitor based on the signal; and a determination unit configured to determine whether the capacitor has degraded or not based on at least one of a first result of comparison of the charging time with a reference charging time serving as a reference for determining degradation of the capacitor, and a second result of comparison (Continued)

of the discharging time with a reference discharging time serving as a reference for determining degradation of the capacitor.

13 Claims, 7 Drawing Sheets

(51) Int. Cl.
*H02M 1/088* (2006.01)
*H02M 7/797* (2006.01)
*H02M 1/36* (2007.01)

(52) U.S. Cl.
CPC ...... *H02M 1/36* (2013.01); *H02M 2007/4835* (2013.01)

(56) References Cited

U.S. PATENT DOCUMENTS

2011/0018551 A1* 1/2011 Yamane ............... G01R 31/392 324/548
2016/0313387 A1* 10/2016 Schweizer ............. G01R 31/64

FOREIGN PATENT DOCUMENTS

| JP | H0880055 A | 3/1996 |
| JP | H0919003 A | 1/1997 |
| JP | 2006236666 A | 9/2006 |
| JP | 2007240450 A | 9/2007 |
| JP | 2008017613 A | 1/2008 |
| JP | 2010511876 A | 4/2010 |
| JP | 2016100926 A | 5/2016 |
| JP | 2017070139 A | 4/2017 |

OTHER PUBLICATIONS

Notice of Reasons for Refusal dated Jan. 16, 2018, by the Japan Patent Office for Application No. 2017-552189 (and translation).
Notice of Reasons for Refusal dated Oct. 24, 2017, by the Japan Patent Office for Application No. 2017-552189 (and translation).
Extended European Search Report dated Apr. 21, 2020 for corresponding European patent application No. 17911184.4, 9 pages.
European communication pursuant to Article 94(3) EPC dated Oct. 13, 2020 for corresponding European Patent Application No. 17911184.4, 9 pages.

\* cited by examiner

MODULAR MULTILEVEL CONVERTER HAVING CAPACITOR DEGRADATION DETERMINATION

TECHNICAL FIELD

The present disclosure relates to a power conversion device for converting AC power into DC power and vice versa.

BACKGROUND ART

A modular multilevel converter (MMC) is known as a large-capacity power conversion device connected to an electric power system. The MMC includes, for each phase of AC, an upper arm connected to a high-potential-side DC terminal and a lower arm connected to a low-potential-side DC terminal. Each arm is made up of a plurality of cascaded submodules.

The capacitance of capacitors provided in the MMC decreases due to degradation over time and the like. Since the capacitance decrease may cause a failure of the MMC, there are known techniques for checking a degraded state of the capacitors.

Japanese National Patent Publication No. 2010-511876 (PTL 1), for example, discloses a device including a phase module for converting a current. This device includes capacitor diagnosis means for continually determining the capacitance of a capacitor included in a submodule.

CITATION LIST

Patent Literature

PTL 1: Japanese National Patent Publication No. 2010-511876

SUMMARY OF INVENTION

Technical Problem

According to PTL 1, a branch current flowing in the phase module and a voltage of the capacitor in the submodule are detected, and the capacitance of each capacitor is calculated based on a charge change obtained by integration of the branch current in specific time intervals, and a voltage change.

In this manner, it is required in PTL 1 to perform a process of measuring both the branch current and the capacitor voltage, and integrating the branch current, in order to calculate the capacitance of the capacitor. Thus, a power conversion device having a large number of submodules suffers from an increased complexity in the process of the entire device and increased cost.

An object in one aspect of the present disclosure is to provide a power conversion device capable of more easily determining a degraded state of a capacitor in a submodule.

Solution to Problem

According to one embodiment, a power conversion device configured to perform power conversion between a DC circuit and an AC circuit is provided. The power conversion device includes power conversion circuitry including a plurality of submodules connected in series to each other. Each of the submodules includes a capacitor. The power conversion device further includes: a signal reception unit configured to receive a signal representing a voltage of the capacitor in each of the submodules; a time calculation unit configured to calculate at least one of a charging time of the capacitor and a discharging time of the capacitor based on the signal; and a determination unit configured to determine whether the capacitor has degraded or not based on at least one of a first result of comparison of the charging time calculated by the time calculation unit with a reference charging time serving as a reference for determining degradation of the capacitor, and a second result of comparison of the discharging time calculated by the time calculation unit with a reference discharging time serving as a reference for determining degradation of the capacitor.

According to another embodiment, a power conversion device configured to perform power conversion between a DC circuit and an AC circuit is provided. The power conversion device includes power conversion circuitry including a plurality of submodules connected in series to each other. Each of the submodules includes a capacitor. The power conversion device further includes: a signal reception unit configured to receive a signal representing a voltage of the capacitor in each of the submodules; a ripple calculation unit configured to calculate a ripple rate of the voltage of the capacitor based on the signal; and a determination unit configured to determine whether the capacitor has degraded or not based on the calculated ripple rate and a reference ripple rate serving as a reference for determining degradation of the capacitor.

Advantageous Effects of Invention

According to the present disclosure, a degraded state of a capacitor in a submodule can be determined more easily.

DESCRIPTION OF EMBODIMENTS

In the following, embodiments of the present invention are described with reference to the drawings. In the following description, identical components are denoted by identical characters. Their names and functions are also identical.

Accordingly, a detailed description thereof is not repeated.

Configuration of Power Conversion Device

Figure 1:
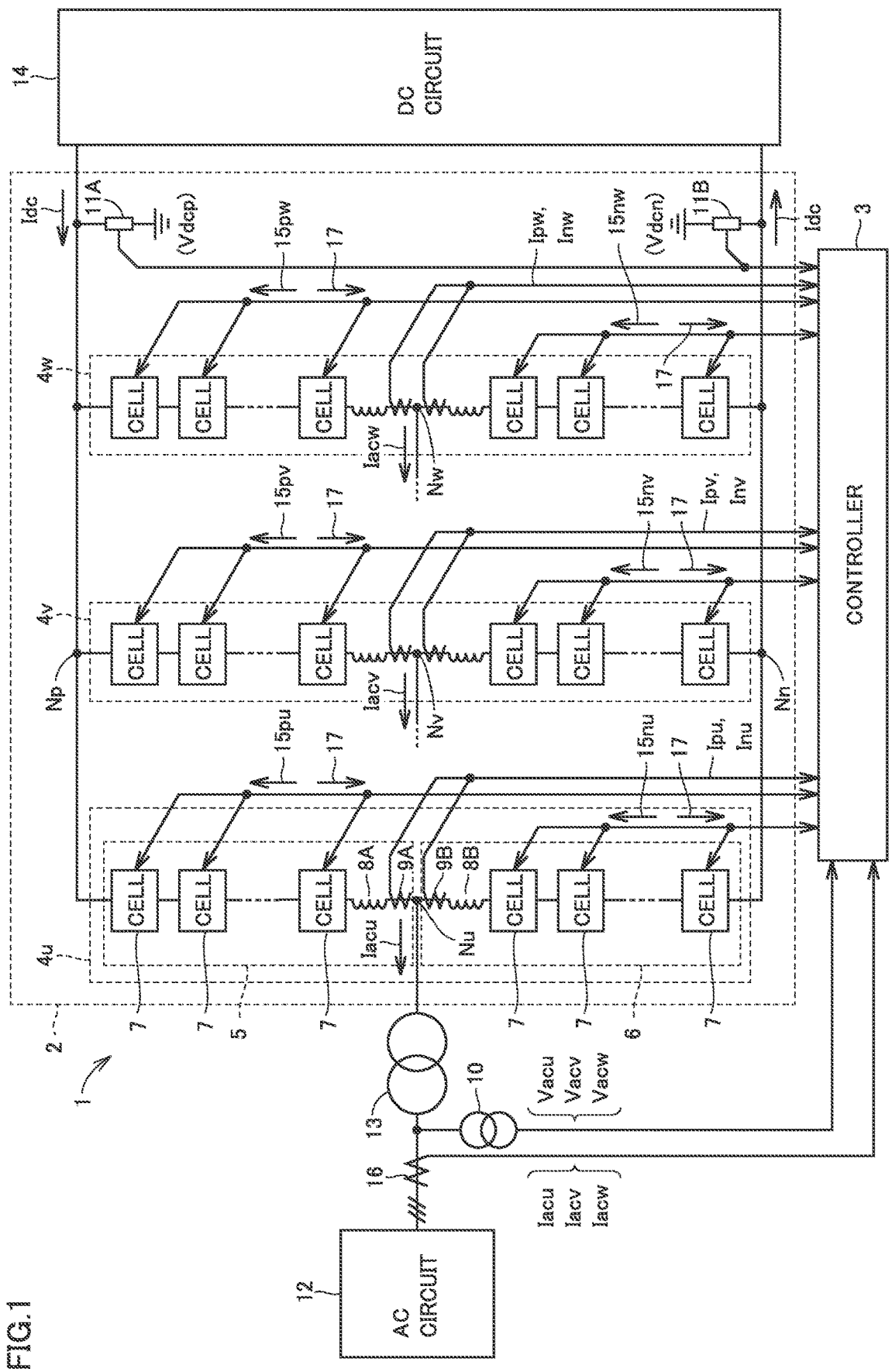
FIG. 1 is a schematic configuration diagram of a power conversion device according to the present embodiment.

FIG. 1 is a schematic configuration diagram of a power conversion device according to the present embodiment.

Referring to FIG. 1, a power conversion device 1 is made up of a modular multilevel converter including a plurality of submodules (which correspond to "cells" in FIG. 1) 7 connected in series to each other. It should be noted that the "submodule" is also referred to as "converter cell." Power conversion device 1 performs power conversion between a DC circuit 14 and an AC circuit 12. Specifically, power conversion device 1 includes power conversion circuitry 2 and a controller 3.

Power conversion circuitry 2 includes a plurality of leg circuits 4u, 4v, 4w (may be referred to non-specifically as leg circuit(s) 4) connected in parallel with each other between a positive DC terminal (i.e., high-potential-side DC terminal) Np and a negative DC terminal (i.e., low-potential-side DC terminal) Nn.

Leg circuit 4 is provided for each of a plurality of phases of AC. Leg circuit 4 is connected between AC circuit 12 and DC circuit 14 for performing power conversion between the AC circuit and the DC circuit. AC circuit 12 shown in FIG. 1 is a three-phase AC system, and three leg circuits 4u, 4v, and 4w are arranged for U phase, V phase, and W phase, respectively.

AC input terminals Nu, Nv, Nw arranged respectively in leg circuits 4u, 4v, 4w are each connected through an interconnection transformer 13 to AC circuit 12. AC circuit 12 is an AC power system including an AC power source, for example. FIG. 1 does not show connection between AC input terminals Nv, Nw and interconnection transformer 13 for the sake of simplifying the drawing.

High-potential-side DC terminal Np and low-potential-side DC terminal Nn that are connected commonly to leg circuits 4 are connected to DC circuit 14. DC circuit 14 is a DC terminal for a DC power system including a DC transmission network or the like, or a DC terminal for another power conversion device. In the latter case, the two power conversion devices are coupled together to form a BTB (Back To Back) system for connecting AC power systems that are different from each other in the rated frequency, for example.

The leg circuits may be connected to AC circuit 12 through an interconnection reactor, instead of interconnection transformer 13 in FIG. 1. Further, instead of AC input terminals Nu, Nv, Nw, primary windings may be arranged in respective leg circuits 4u, 4v, 4w, and AC connection from leg circuits 4u, 4v, 4w to interconnection transformer 13 or the interconnection reactor may be implemented through secondary windings magnetically coupled with the respective primary windings. In this case, the primary windings may be reactors 8A, 8B as described below. Specifically, electrical connection (namely DC or AC connection) from leg circuit 4 to AC circuit 12 may be implemented through connecting parts such as AC input terminals Nu, Nv, Nw or the aforementioned primary windings arranged in respective leg circuits 4u, 4v, 4w.

Leg circuit 4u includes an upper arm 5 from high-potential-side DC terminal Np to AC input terminal Nu, and a lower arm 6 from low-potential-side DC terminal Nn to AC input terminal Nu. The connection point between upper arm 5 and lower arm 6, that is, AC input terminal Nu, is connected to interconnection transformer 13. High-potential-side DC terminal Np and low-potential-side DC terminal Nn are connected to DC circuit 14. Leg circuits 4v, 4w have a similar configuration to the above-described one, and therefore, leg circuit 4u is explained below as a representative of the leg circuits.

Upper arm 5 includes a plurality of cascaded submodules 7 and reactor 8A. The plurality of submodules 7 and reactor 8A are connected in series to each other.

Likewise, lower arm 6 includes a plurality of cascaded submodules 7 and reactor 8B. The plurality of submodules 7 and reactor 8B are connected in series to each other.

The position in which reactor 8A is inserted may be any position in upper arm 5 of leg circuit 4u, and the position in which reactor 8B is inserted may be any position in lower arm 6 of leg circuit 4u. More than one reactor 8A and more than one reactor 8B may be arranged. Respective inductance values of the reactors may be different from each other. Alternatively, only reactor 8A of upper arm 5, or only reactor 8B of lower arm 6 may be arranged.

Reactors 8A, 8B are arranged for preventing a sharp increase of fault current generated in the event of a fault in AC circuit 12 or DC circuit 14, for example. Excessively large inductance values of reactors 8A, 8B, however, result in a problem that the efficiency of the power conversion device is decreased. It is preferable, therefore, to turn off all switching elements in each submodule 7 as quickly as possible in the event of a fault.

Power conversion device 1 in FIG. 1 further includes, as detectors for measuring the amount of electricity (current, voltage, for example) to be used for control, an AC voltage detector 10, an AC current detector 16, DC voltage detector 11A, 11B, and arm current detector 9A, 9B disposed in each leg circuit 4.

Signals detected by these detector are input to controller 3. Based on these detected signals, controller 3 outputs operation commands 15pu, 15nu, 15pv, 15nv, 15pw, 15nw for controlling the operating states of the respective submodules. Controller 3 also receives, from each submodule, a signal 17 representing a detected value of the voltage of a capacitor disposed in the submodule (cell capacitor voltage described later).

Controller 3 may be implemented by a dedicated circuit, or implemented partially or entirely by an FPGA (Field Programmable Gate Array) and/or a microprocessor. Controller 3 may be implemented by a digital protection relay device, for example.

In the present embodiment, operation commands 15pu, 15nu, 15pv, 15nv, 15pw, and 15nw are generated for the U phase upper arm, the U phase lower arm, the V phase upper arm, the V phase lower arm, the W phase upper arm, and the W phase lower arm, respectively. In the following description, operation commands 15pu, 15nu, 15pv, 15nv, 15pw, 15nw may be referred to collectively or non-specifically as operation command 15.

For the sake of simplifying the drawing, FIG. 1 shows collectively some of signal lines for signals that are input from respective detectors to controller 3 and signal lines for signals that are input or output between controller 3 and respective submodules. Actually, however, the signal line is disposed for each detector and each submodule 7. The signal line between each submodule and controller 3 may be provided as separate transmission line and reception line. For example, these signals are transmitted through optical fibers for the sake of noise immunity.

In the following, each detector is described specifically. AC voltage detector 10 detects a U phase AC voltage value Vacu, a V phase AC voltage value Vacv, and a W phase AC voltage value Vacw of AC circuit 12. AC current detector 16 detects a U phase AC current value Iacu, a V phase AC current value Iacv, and a W phase AC current value Iacw of AC circuit 12. DC voltage detector 11A detects a DC voltage value Vdcp of high-potential-side DC terminal Np connected to DC circuit 14. DC voltage detector 11B detects a DC voltage value Vdcn of low-potential-side DC terminal Nn connected to DC circuit 14.

Arm current detector 9A, 9B disposed in U phase leg circuit 4u detect an upper arm current Ipu flowing in upper arm 5 and a lower arm current Inu flowing in lower arm 6, respectively. Likewise, arm current detector 9A, 9B disposed in V phase leg circuit 4v detect an upper arm current Ipv and a lower arm current Inv, respectively. Arm current detector 9A, 9B disposed in W phase leg circuit 4w detect an upper arm current Ipw and a lower arm current Inw, respectively.

Example Configuration of Submodule

Figure 2:
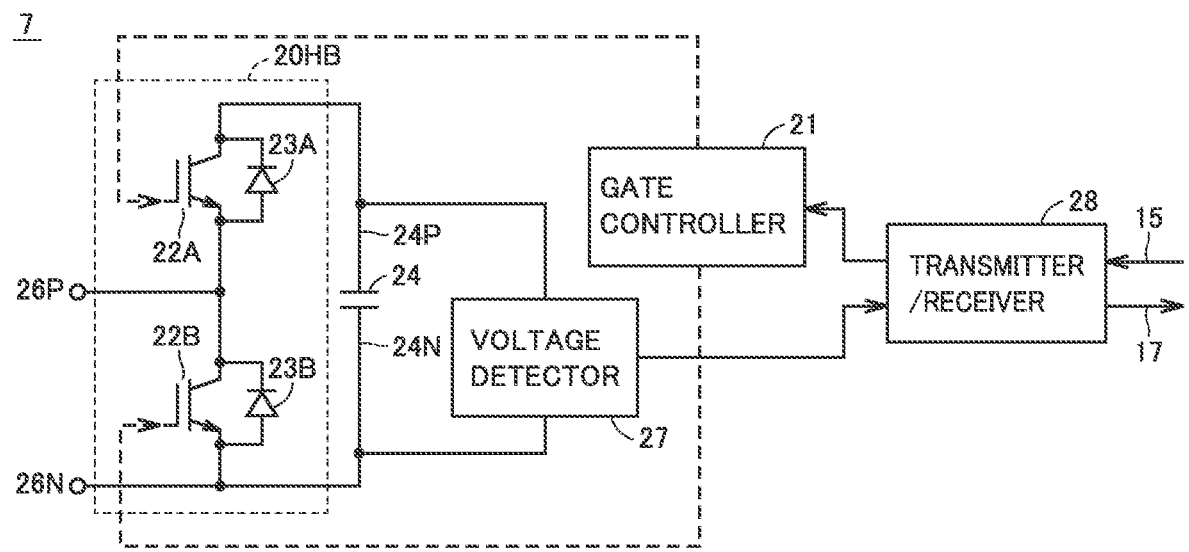
FIG. 2 is a circuit diagram showing an example submodule which is a component of each leg circuit in FIG. 1.

FIG. 2 is a circuit diagram showing an example submodule which is a component of each leg circuit in FIG. 1. Submodule 7 shown in FIG. 2 includes a half-bridge-type conversion circuit 20HB, a DC capacitor 24 serving as an energy storage, a gate controller 21, a voltage detector 27, and a transmitter/receiver 28.

Half-bridge-type conversion circuit 20HB includes switching elements 22A, 22B connected in series to each other, and diodes 23A, 23B. Diodes 23A, 23B are connected in anti-parallel (i.e., in parallel in the reverse-bias direction) with switching elements 22A, 22B, respectively. DC capacitor 24 is connected in parallel with the series-connected circuit made up of switching elements 22A, 22B for holding a DC voltage. A connection node of switching elements 22A, 22B is connected to a high-potential-side input/output terminal 26P. A connection node of switching element 22B and DC capacitor 24 is connected to a low-potential-side input/output terminal 26N.

Gate controller 21 operates in accordance with operation command 15 received from controller 3 in FIG. 1. During normal operation (i.e., zero voltage or a positive voltage is output between input/output terminals 26P and 26N), gate controller 21 performs control to cause one of switching elements 22A, 22B to be in the ON state and the other to be in the OFF state. While switching element 22A is in the ON state and switching element 22B is in the OFF state, a voltage across DC capacitor 24 is applied between input/output terminals 26P and 26N. On the contrary, while switching element 22A is in the OFF state and switching element 22B is in the ON state, the voltage between input/output terminals 26P and 26N is 0 V.

Thus, submodule 7 shown in FIG. 2 can cause switching elements 22A, 22B to become the ON state alternately to thereby output zero voltage or a positive voltage depending on the voltage of DC capacitor 24. Diodes 23A, 23B are provided for the sake of protection when a reverse-direction voltage is applied to switching elements 22A, 22B.

In contrast, when controller 3 in FIG. 1 detects that the arm current is an overcurrent, gate controller 21 turns off both switching elements 22A, 22B for the sake of circuit protection. Accordingly, in the event of a ground fault of DC circuit 14, for example, a fault current flows through diode 23B.

Voltage detector 27 detects the voltage between opposite terminals 24P and 24N of DC capacitor 24. In the following description, the voltage of DC capacitor 24 (also referred to simply as "capacitor 24" hereinafter) is also referred to as cell capacitor voltage. Transmitter/receiver 28 transmits, to gate controller 21, operation command 15 received from controller 3 in FIG. 1, and transmits, to controller 3, signal 17 representing the cell capacitor voltage detected by voltage detector 27.

Above-described gate controller 21, voltage detector 27, and transmitter/receiver 28 may be implemented by a dedicated circuit, or implemented by an FPGA (Field Programmable Gate Array), or the like.

As each of switching elements 22A, 22B, a self-arc-extinguishing-type switching element is used, of which ON operation and OFF operation can both be controlled. An IGBT (Insulated Gate Bipolar Transistor) or a GCT (Gate Commutated Turn-off thyristor), for example, is used as each of switching element 22A, 22B.

It should be noted that the configuration of submodule 7 described above is exemplary, and submodule 7 having another configuration may be applied to the present embodiment. For example, submodule 7 may be implemented by a full-bridge-type conversion circuit or a three-quarter-bridge-type conversion circuit.

Methods of Determining Capacitor Degradation

Various methods of determining capacitor degradation according to the present embodiment are described.

<Charging Time>

A method of determining the degradation of capacitor 24 using a charging time of capacitor 24 is described here.

Typically, when power conversion device 1 is in a stopped state, capacitor 24 in each submodule 7 is in a completely discharged state, and switching elements 22A, 22B are each in the OFF state. In order to start the operation of power conversion device 1, it is necessary to first charge capacitor 24 in each submodule 7 (initial charging). During the initial charging, a circuit breaker (not shown) connected to the primary side (AC circuit 12 side) of interconnection transformer 13 is turned on, to thereby charge all capacitors 24 simultaneously.

When the cell capacitor voltage is represented by Vc, the capacitance of capacitor 24 is represented by C, and a current flowing in capacitor 24 is represented by Ic, then the following equation (1) is satisfied. It should be noted that $\Delta Vc$ represents variation in the cell capacitor voltage in a certain period of time:

$$\Delta V_C = \frac{1}{C} \int I_C \cdot dt \quad (1)$$

As represented by the equation (1), it can be seen that, when current Ic flows in all capacitors 24, variation $\Delta Vc$ in the cell capacitor voltage increases with decrease in capacitance C.

Thus, in power conversion circuitry 2, capacitor 24 with reduced capacitance C due to degradation over time (also referred to as "degraded capacitor" hereinafter) has greater variation $\Delta Vc$ (i.e., amount of voltage increase) in the cell capacitor voltage in the certain period of time than healthy capacitor 24 that has not degraded (also referred to as "healthy capacitor" hereinafter). That is, a charging time of the degraded capacitor is shorter than a charging time of the healthy capacitor.

Figure 3:
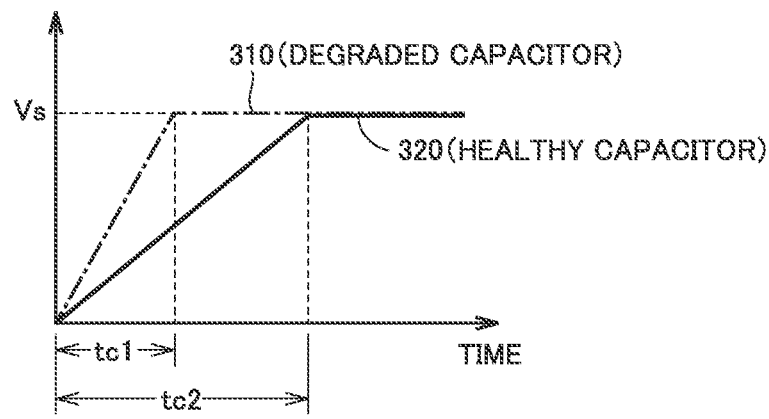
FIG. 3 shows a time change in cell capacitor voltage during charging of capacitors according to the present embodiment.

FIG. 3 shows a time change in the cell capacitor voltage during charging of capacitors according to the present embodiment. FIG. 3 shows the cell capacitor voltage on the vertical axis, and time on the horizontal axis. Referring to FIG. 3, a graph 310 indicates a time change in the cell capacitor voltage of a degraded capacitor during charging. A graph 320 indicates a time change in the cell capacitor voltage of a healthy capacitor during charging. In the degraded capacitor, a time between when the cell capacitor voltage is 0 and when the cell capacitor voltage reaches a voltage (a raged voltage Vs, for example) required for normal operation of power conversion device 1 (i.e., a charging time) is tc1. A charging time of the healthy capacitor, on the other hand, is a time tc2 longer than time tc1.

Based on signal 17 representing the cell capacitor voltage received from submodule 7, controller 3 calculates a charging time Tc of capacitor 24. Controller 3 determines that capacitor 24 has degraded when calculated charging time Tc is less than a reference charging time Tcx serving as a reference for determining the degradation of capacitor 24. Reference charging time Tcx can be set based on the charging time of the healthy capacitor. Reference charging time Tcx is set to a fraction of the charging time of a new capacitor, for example, but may be set arbitrarily by a system administrator without being limited thereto.

According to the above, by measuring the cell capacitor voltage of each capacitor 24 at the time of initial charging that is performed during startup of power conversion device 1, a degraded state of each capacitor 24 can be determined.

<Discharging Time>

A method of determining the degradation of capacitor 24 using a discharging time of capacitor 24 is described here.

Power conversion device 1 causes, when performing stop operation, capacitor 24 in each submodule 7 to discharge. The power conversion device performs the discharging, for example, by controlling respective switching elements 22A, 22B such that all submodules 7 maintain a positive or negative voltage output state.

When all capacitors 24 discharge, it can be seen with reference to the equation (1) that variation ΔVc (i.e., amount of voltage drop) in the cell capacitor voltage increases with decrease in capacitance C. Thus, in power conversion circuitry 2, a discharge time of the degraded capacitor is shorter than a discharge time of the healthy capacitor.

Figure 4:
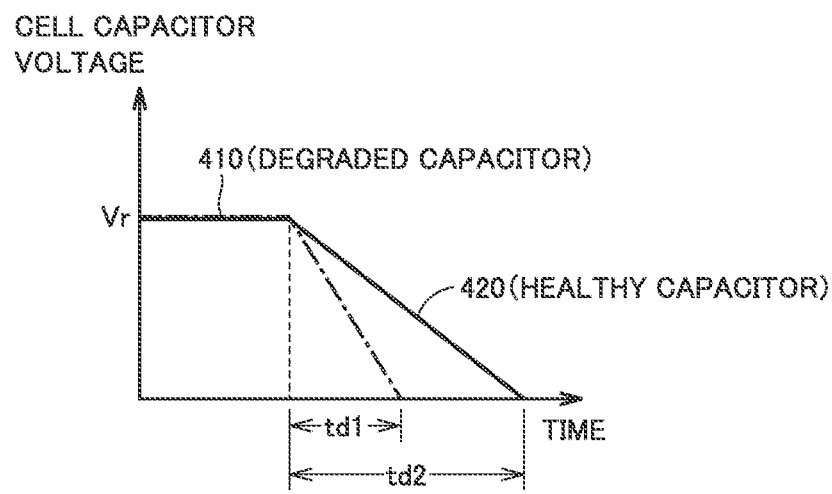
FIG. 4 shows a time change in cell capacitor voltage during discharging of capacitors according to the present embodiment.

FIG. 4 shows a time change in the cell capacitor voltage during discharging of capacitors according to the present embodiment. FIG. 4 shows the cell capacitor voltage on the vertical axis, and time on the horizontal axis. Referring to FIG. 4, a graph 410 indicates a time change in the cell capacitor voltage of a degraded capacitor during discharging. A graph 420 indicates a time change in the cell capacitor voltage of a healthy capacitor during discharging.

In the degraded capacitor, a time between when the cell capacitor voltage is a voltage Vr (which corresponds to the voltage during normal operation) and when the cell capacitor voltage reaches 0 (i.e., a discharging time) is td1. A discharging time of the healthy capacitor, on the other hand, is a time td2 longer than time td1.

Based on signal 17 representing the cell capacitor voltage received from submodule 7, controller 3 calculates a discharging time Td of capacitor 24. Controller 3 determines that capacitor 24 has degraded when calculated discharging time Td is less than a reference discharging time Tdx serving as a reference for determining the degradation of capacitor 24. Reference discharging time Tdx can be set based on the discharging time of the healthy capacitor. Reference discharging time Tdx is set to a fraction of the discharging time of a new capacitor, for example, but may be set arbitrarily by the system administrator without being limited thereto.

According to the above, by measuring the cell capacitor voltage of each capacitor 24 at the time of discharging that is performed during a stop of operation of power conversion device 1, a degraded state of each capacitor 24 can be determined.

<Voltage Change Rate>

A method of determining the degradation of capacitor 24 using a change rate in the cell capacitor voltage during charging and discharging of capacitor 24 is described here.

A voltage change rate dVc/dt in cell capacitor voltage Vc during charging and discharging is represented by an equation (2):

$$\frac{dV_C}{dt} = \frac{I_C}{C} \qquad (2)$$

As represented by the equation (2), it can be seen that, when current Ic in each capacitor 24 during charging and discharging is uniform, the voltage change rate of the cell capacitor voltage increases with decrease in capacitance C. That is, an absolute value of the voltage change rate of the degraded capacitor is greater than an absolute value of the voltage change rate of the healthy capacitor.

Referring to FIG. 3, the voltage change rate of the degraded capacitor during charging corresponds to the slope of a line of graph 310 at time tc1. The voltage change rate of the healthy capacitor corresponds to the slope of a line of graph 320 at time tc2. It should be noted that the voltage change rate during charging may be an average change rate of the cell capacitor voltage between the start of charging and the end of charging (i.e., a charging period).

Based on signal 17 representing the cell capacitor voltage received from submodule 7, controller 3 calculates a voltage change rate Dc during charging of capacitor 24. Controller 3 determines that capacitor 24 has degraded when an absolute value of calculated voltage change rate Dc is greater than or equal to a reference voltage change rate Dcx (note: Dcx>0) serving as a reference for determining the degradation of capacitor 24.

Reference voltage change rate Dcx can be set based on the voltage change rate of the healthy capacitor during charging. Reference voltage change rate Dcx is set to a fraction of the voltage change rate of a new capacitor, for example, but may be set arbitrarily by the system administrator without being limited thereto.

Likewise, referring to FIG. 4, the voltage change rate of the degraded capacitor during discharging corresponds to the slope of a line of graph 410 at time td1. The voltage change rate of the healthy capacitor corresponds to the slope of a line of graph 420 at time td2. It should be noted that the voltage change rate during discharging may be an average change rate of the cell capacitor voltage between the start of discharging and the end of discharging (i.e., a discharging period).

Based on signal 17 representing the cell capacitor voltage received from submodule 7, controller 3 calculates a voltage change rate Dd during discharging of capacitor 24. Controller 3 determines that capacitor 24 has degraded when an absolute value of calculated voltage change rate Dd is greater than or equal to a reference voltage change rate Ddx (note: Ddx>0) serving as a reference for determining the degradation of capacitor 24.

Reference voltage change rate Ddx during discharging can be set based on the voltage change rate of the healthy capacitor during discharging. Reference voltage change rate Ddx is set to a fraction of the voltage change rate of a new capacitor, for example, but may be set arbitrarily by the system administrator without being limited thereto.

According to the above, the degraded state of each capacitor 24 can be determined at the time of initial charging that is performed during startup of power conversion device 1, and at the time of discharging that is performed during a stop of operation. The degradation determination can be carried out using a similar reference for each capacitor 24 when there is variation in voltage among capacitors 24 during a stop of operation of power conversion device 1, or when there is variation in voltage among capacitors 24 when the operation of power conversion device 1 is resumed after being suspended.

<Use of History Information>

The reference charging time, the reference discharging time and the reference voltage change rate have been described above as being set based on the charging time, the discharging time, and the voltage change rate of the healthy capacitor, respectively. In the following, the reference charging time, the reference discharging time and the reference voltage change rate are described as being set based on history information on the charging time, history information on the discharging time, and history information on the voltage change rate of capacitor 24, respectively.

Specifically, controller 3 stores a charging time and a voltage change rate of each capacitor 24, which were calculated for each initial charging, as history information in an internal memory. Controller 3 also stores a discharging time and a voltage change rate of each capacitor 24, which were calculated for each discharging, as history information in the internal memory.

Controller 3 compares charging time Tc that was calculated during initial charging with reference charging time Tcx that was set based on past history information (multiple charging times). Reference charging time Tcx is set, for example, to a time shorter by a certain time than an average value of the multiple charging times. In this case, controller 3 determines that capacitor 24 has degraded when calculated charging time Tc is less than reference charging time Tcx (i.e., shorter by a certain time or more than the average value of the multiple charging times).

Controller 3 also compares the discharging time and the voltage change rate with their past history information, respectively, to carry out the degradation determination of capacitor 24. Reference discharging time Tdx is set, for example, to a time shorter by a certain time than an average value of the multiple discharging times.

Reference voltage change rate Dcx is set based on the history information on the voltage change rate in a charging period of capacitor 24, and is set, for example, to a value greater by a certain value than an average value of absolute values of the multiple voltage change rates. Reference voltage change rate Ddx is set based on the history information on the voltage change rate in a discharging period of capacitor 24, and is set, for example, to a value greater by a certain value than the average value of the absolute values of the multiple voltage change rates.

According to the above, the degradation determination of capacitor 24 is carried out based on the plurality of pieces of data stored as history information. Thus, the degradation determination can be carried out accurately when there is variation in measurements of the cell capacitor voltage.

<Degradation Determination During Inspection>

A method of determining the degradation of capacitor 24 by performing simultaneous charging and simultaneous discharging of all capacitors 24 multiple times during maintenance of power conversion device 1 is described here.

Controller 3 causes simultaneous charging and simultaneous discharging of all capacitors 24 to be repeated multiple times, to calculate multiple charging times, multiple discharging times and multiple voltage change rates. It is assumed that simultaneous charging and simultaneous discharging are each performed three times, for example.

In this case, controller 3 determines that capacitor 24 has degraded when a condition is satisfied that at least two of the three charging times are less than reference charging time Tcx. Applying a more stringent criterion, controller 3 may determine that capacitor 24 has degraded when at least one charging time is less than reference charging time Tcx.

Likewise, controller 3 determines that capacitor 24 has degraded when a condition is satisfied that at least two of the three discharging times are less than reference discharging time Tdx. Controller 3 determines that capacitor 24 has degraded when a condition is satisfied that absolute values of at least two of the three voltage change rates are greater than or equal to the reference voltage change rate.

According to the above, the degradation determination can be carried out accurately when there is variation in measurements of the cell capacitor voltage.

<Voltage Ripple Rate>

A method of determining the degradation of capacitor 24 using a ripple rate of the cell capacitor voltage of capacitor 24 during normal operation of power conversion device 1 is described here.

During normal operation of power conversion device 1, a current flows in capacitor 24 depending on the ON/OFF state of each of switching elements 22A, 22B in submodule 7. Thus, the cell capacitor voltage during normal operation varies constantly as shown in FIG. 5.

Figure 5:
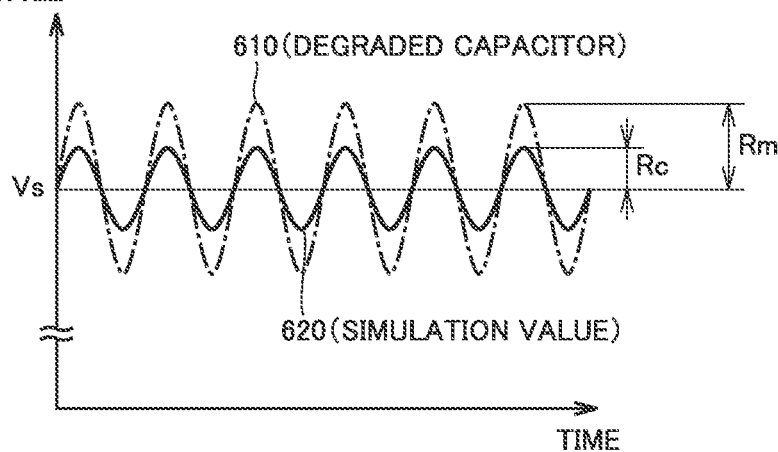
FIG. 5 shows a time change in cell capacitor voltage during normal operation of the power conversion device according to the present embodiment.

FIG. 5 shows a time change in the cell capacitor voltage during normal operation of power conversion device 1 according to the present embodiment. FIG. 5 shows the cell capacitor voltage on the vertical axis, and time on the horizontal axis. Referring to FIG. 5, a graph 610 indicates a time change in the cell capacitor voltage of a degraded capacitor during normal operation. A graph 620 indicates a time change in the cell capacitor voltage during normal operation, which was theoretically calculated or calculated by simulation. The simulation is performed in a state where the capacitance of capacitor 24 does not decrease (rated value). An AC component of a voltage waveform indicated by graph 610 is represented by Rm, and an AC component of a voltage waveform indicated by graph 620 is represented by Rc. A DC component of the voltage waveform of each of graph 610 and graph 620 is rated voltage Vs.

The voltage waveform corresponding to graph 620 can be theoretically calculated or calculated by simulation for each capacitor 24 with a known method, depending on the operating state (active power output value and reactive power output value, for example) of power conversion device 1. AC component Rc of graph 620 is thus calculated.

Here, as represented by the above-described equation (1), variation ΔVc in the cell capacitor voltage increases with decrease in capacitance C. Thus, the cell capacitor voltage of the degraded capacitor varies more widely than the cell capacitor voltage of the healthy capacitor. Specifically, as shown in FIG. 5, AC component Rm of the cell capacitor voltage waveform of the degraded capacitor is greater than AC component Rc of the cell capacitor voltage waveform calculated by simulation. That is, a voltage ripple rate (=AC component/DC component) of the degraded capacitor is greater than a voltage ripple rate calculated by simulation (also referred to as "reference ripple rate" hereinafter).

Based on signal 17 representing the cell capacitor voltage received from submodule 7, controller 3 calculates a ripple rate of the cell capacitor voltage. Controller 3 determines that capacitor 24 has degraded when the calculated ripple rate is greater than or equal to the reference ripple rate by a predetermined value. The predetermined value may be set arbitrarily by the system administrator.

According to the above, the degradation of capacitor 24 can be determined during normal operation of power conversion device 1 as well. Thus, degraded capacitor 24 can be found earlier when startup operation and stop operation of power conversion device 1 are performed less frequently.

<Summary of Determination Methods>

As described above, various types of determination methods can be employed in the present embodiment. Specifically, during startup, power conversion device 1 carries out the degradation determination of capacitor 24 based on the charging time of capacitor 24 during initial charging, or the voltage change rate in the charging period.

During normal operation, power conversion device 1 carries out the degradation determination of capacitor 24 based on the ripple rate of the cell capacitor voltage of capacitor 24.

During a stop of operation, power conversion device 1 carries out the degradation determination of capacitor 24 based on the discharging time of capacitor 24 during discharging, or the voltage change rate in the discharging period.

During inspection, power conversion device 1 repeats simultaneous charging and simultaneous discharging of all capacitors 24 multiple times, to carry out the degradation determination of capacitor 24 based on the multiple charging times, multiple discharging times and multiple voltage change rates.

In this manner, power conversion device 1 can carry out the degradation determination of capacitor 24 at each timing. Power conversion device 1 may carry out the degradation determination of capacitor 24 by employing at least one of the various types of determination methods described above. Alternatively, power conversion device 1 may carry out the degradation determination of capacitor 24 by combining the various types of determination methods described above.

For example, during charging, power conversion device 1 may determine that capacitor 24 has degraded when at least one of a condition that charging time Tc is less than reference charging time Tcx and a condition that an absolute value of voltage change rate Dc is greater than or equal to reference voltage change rate Dcx is satisfied. During discharging, power conversion device 1 may determine that capacitor 24 has degraded when at least one of a condition that discharging time Td is less than reference discharging time Tdx and a condition that an absolute value of voltage change rate Dd is greater than or equal to reference voltage change rate Ddx is satisfied.

Functional Configuration of Controller 3

Figure 6:
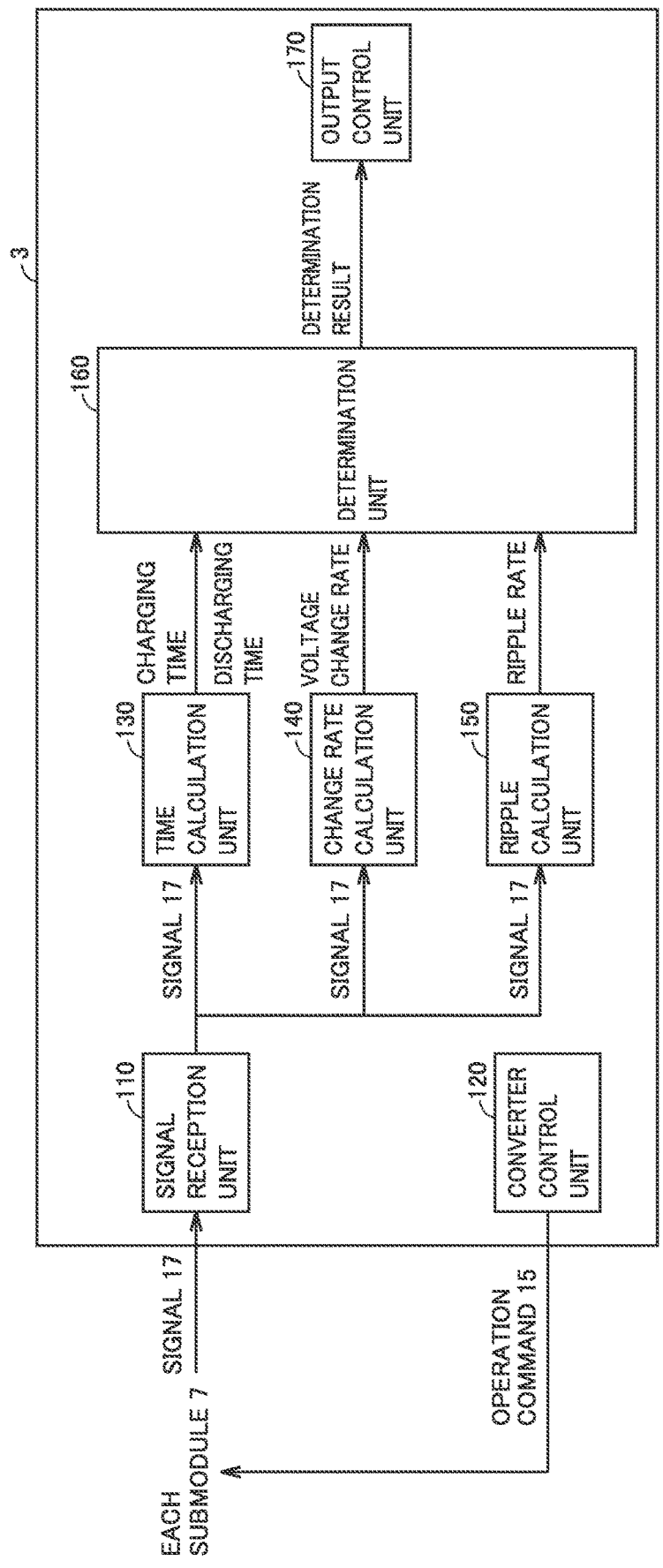
FIG. 6 is a functional block diagram of a controller according to the present embodiment.

FIG. 6 is a functional block diagram of controller 3 according to the present embodiment. Referring to FIG. 6, controller 3 includes, as a main functional configuration, a signal reception unit 110, a converter control unit 120, a time calculation unit 130, a change rate calculation unit 140, a ripple calculation unit 150, a determination unit 160, and an output control unit 170. Each of these functions is implemented by, for example, a microprocessor of controller 3 executing a program stored in a memory. These functions may be implemented partially or entirely by hardware.

Signal reception unit 110 receives, from each submodule 7, signal 17 representing a detected value of the voltage of capacitor 24 in each submodule 7. Signal reception unit 110 receives signal 17 in a predetermined control cycle.

Converter control unit 120 transmits operation command 15 to each submodule 7 to thereby cause switching of each of switching elements 22A, 22B, to drive each submodule 7. For example, converter control unit 120 controls charging and discharging of capacitor 24 in each submodule 7 by operation command 15.

Time calculation unit 130 calculates a charging time of each capacitor 24 based on signal 17 received from each submodule 7. Time calculation unit 130 calculates charging time Tc of each capacitor 24 based on signal 17 from each submodule 7 during charging of each capacitor 24. In another aspect, time calculation unit 130 calculates discharging time Td of each capacitor 24 based on signal 17 from each submodule 7 during discharging of each capacitor 24.

Change rate calculation unit 140 calculates, based on signal 17 from each submodule 7, voltage change rate Dc of each capacitor 24 in a charging period of each capacitor 24. In another aspect, change rate calculation unit 140 calculates, based on signal 17 from each submodule 7, voltage change rate Dd of each capacitor 24 in a discharging period of each capacitor 24.

Ripple calculation unit 150 calculates, during normal operation, based on signal 17 from each submodule 7, a ripple rate of the cell capacitor voltage of each capacitor 24.

Determination unit 160 determines the degradation of each capacitor 24 based on at least one of a calculation result from time calculation unit 130, a calculation result from change rate calculation unit 140, and a calculation result from ripple calculation unit 150.

In one aspect, determination unit 160 determines that capacitor 24 has degraded when charging time Tc is less than reference charging time Tcx during charging of each capacitor 24, and otherwise determines that capacitor 24 has not degraded.

Determination unit 160 determines that capacitor 24 has degraded when an absolute value of voltage change rate Dc is greater than or equal to reference voltage change rate Dcx during charging of each capacitor 24, and otherwise determines that capacitor 24 has not degraded.

In another aspect, determination unit 160 determines that capacitor 24 has degraded when discharging time Td is less than reference discharging time Tdx during discharging of each capacitor 24, and otherwise determines that capacitor 24 has not degraded. Determination unit 160 determines that capacitor 24 has degraded when an absolute value of voltage change rate Dd is greater than or equal to reference voltage change rate Ddx during discharging of each capacitor 24, and otherwise determines that capacitor 24 has not degraded.

In still another aspect, determination unit 160 may determine whether capacitor 24 has degraded or not based on at least one of a result of comparison of charging time Tc with reference charging time Tcx, and a result of comparison of discharging time Td with reference discharging time Tdx. For example, determination unit 160 determines that capacitor 24 has degraded when at least one of a condition that charging time Tc is less than reference charging time Tcx and a condition that discharging time Td is less than reference discharging time Tdx is satisfied.

In still another aspect, determination unit 160 may determine that capacitor 24 has degraded when at least one of a condition that charging time Tc is less than reference charging time Tcx and a condition that voltage change rate Dc is greater than or equal to reference voltage change rate Dcx is satisfied. Determination unit 160 may determine that capacitor 24 has degraded when at least one of a condition that discharging time Td is less than reference discharging time Tdx and a condition that voltage change rate Dd is greater than or equal to reference voltage change rate Ddx is satisfied.

In still another aspect, determination unit 160 may determine that capacitor 24 has degraded when a condition that charging time Tc is less than reference charging time Tcx is satisfied multiple times at the time of inspection during which charging and discharging are repeated multiple times. Alternatively, determination unit 160 may determine that capacitor 24 has degraded when a condition that discharging time Td is less than reference discharging time Tdx is satisfied multiple times.

In still another aspect, determination unit 160 may determine, during normal operation of power conversion device 1, whether capacitor 24 has degraded or not based on the ripple rate calculated by ripple calculation unit 150 and the reference ripple rate.

Output control unit 170 outputs a determination result from determination unit 160. Specifically, output control unit 170 causes the determination result to be shown on a display mounted on controller 3. Output control unit 170 may output the determination result to an external device through a communication interface mounted on controller 3. The determination result may include information indicating which one of respective capacitors 24 has degraded.

Modification of Power Conversion Device

Figure 7:
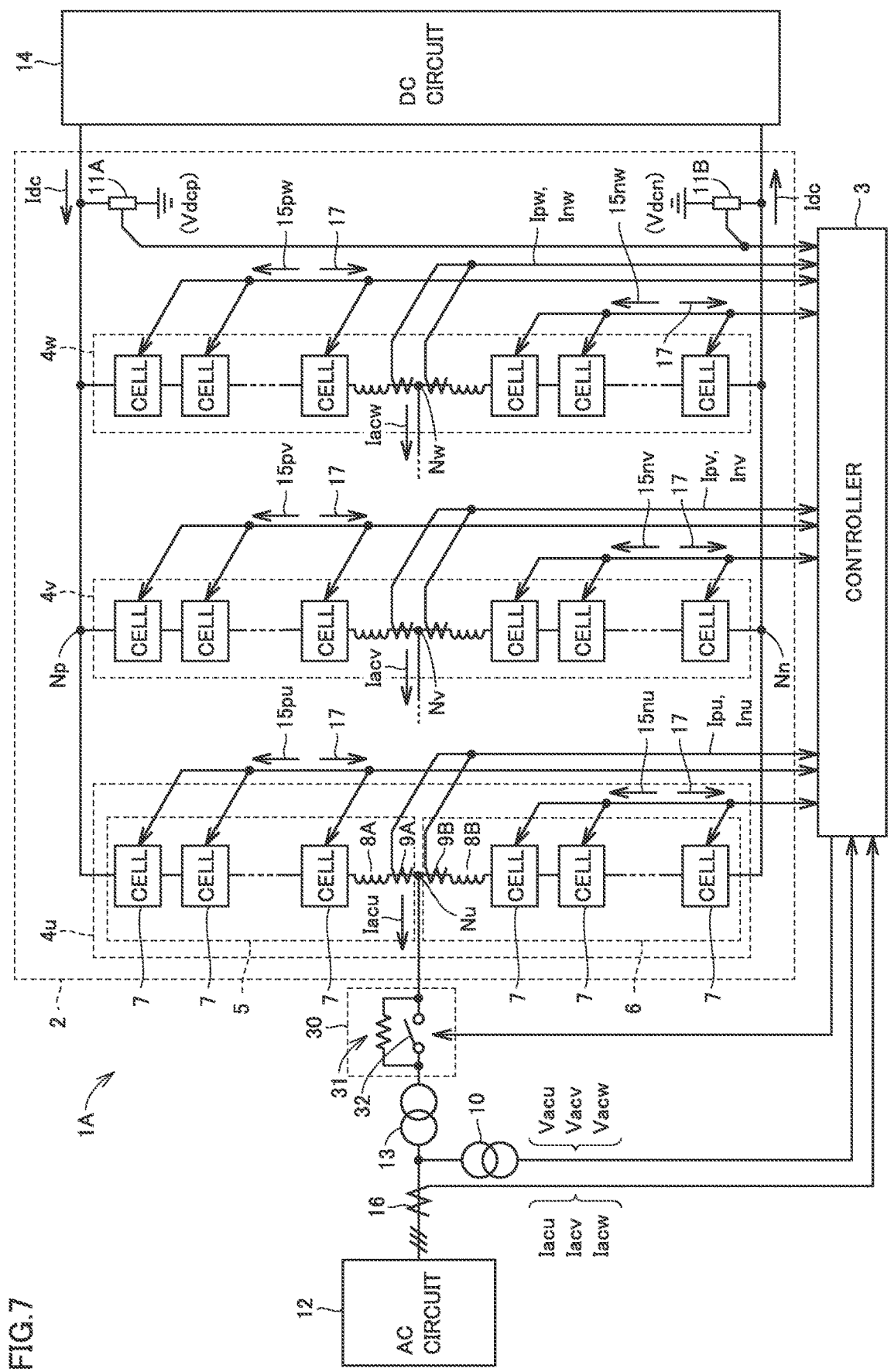
FIG. 7 is a schematic configuration diagram of a power conversion device according to a modification of the present embodiment.

FIG. 7 is a schematic configuration diagram of a power conversion device according to a modification of the present embodiment. Referring to FIG. 7, a power conversion device 1A includes power conversion circuitry 2, controller 3, and a limitation circuit 30. That is, power conversion device 1A has a configuration in which limitation circuit 30 has been added to power conversion device 1 in FIG. 1. A configuration of power conversion device 1A that is different from the configuration of power conversion device 1 is described here.

Limitation circuit 30 limits a current flowing between AC circuit 12 and power conversion circuitry 2. Limitation circuit 30 includes a limitation resistor 31, and a switch 32 connected in parallel with limitation resistor 31.

Controller 3 includes, as a functional configuration, a switch control unit for transmitting a control signal to switch 32 to thereby control switching operation of switch 32. Specifically, during startup of power conversion device 1, the switch control unit controls switch 32 to be in the open state (OFF state). In this case, when a circuit breaker (not shown) for system interconnection is turned on, a charging current flows from AC circuit 12 through limitation resistor 31 of limitation circuit 30 and operation for initial charging of capacitor 24 in each submodule 7 is started. That is, the switch control unit controls switch 32 to be in the OFF state before the start of charging of capacitor 24.

In this case, limitation resistor 31 functions as a charging resistor of capacitor 24, to delay the charging time to make the rise of the cell capacitor voltage more gradual. Thus, capacitor 24 has an extended charging time and a reduced voltage change rate as compared to an example where there is no limitation resistor 31.

Accordingly, the difference between the charging time of the degraded capacitor and the charging time of the healthy capacitor, and the difference between the voltage change rate of the degraded capacitor and the voltage change rate of the healthy capacitor increase, and thus these differences can be detected more reliably. In addition, the detection accuracy (detection resolution) required of voltage detector 27 can be relaxed (lowered). After the completion of initial charging, the switch control unit controls switch 32 to be in the ON state, to thereby short-circuit limitation resistor 31.

During a stop of operation of power conversion device 1, the switch control unit causes switch 32 to be in the OFF state, to start operation for discharging each capacitor 24. That is, the switch control unit controls switch 32 to be in the OFF state before the start of discharging of capacitor 24. In this case, a discharging current flows through limitation resistor 31 of limitation circuit 30 and discharging of capacitor 24 in each submodule 7 is started. In this case, limitation resistor 31 functions as a discharging resistor of capacitor 24, to delay the discharging time to make the fall of the cell capacitor voltage more gradual. Thus, capacitor 24 has an extended discharging time and a reduced voltage change rate as compared to an example where there is no limitation resistor 31.

Accordingly, the difference between the discharging time of the degraded capacitor and the discharging time of the healthy capacitor, and the difference between the voltage change rate of the degraded capacitor and the voltage change rate of the healthy capacitor increase, and thus these differences can be detected more reliably.

Advantages

According to the present embodiment, the degradation determination of a capacitor in each submodule 7 can be carried out by measurement of the cell capacitor voltage of the capacitor, without the need to measure the current flowing in the capacitor. In addition, there is no need to provide a new current sensor for measuring the current flowing in the capacitor for the degradation determination. Further, since there is no need to directly calculate the capacitance of the capacitor, less process steps are required for the degradation determination. Accordingly, a processing load of the entire power conversion device and cost can be reduced.

According to the present embodiment, the degradation determination of a capacitor can be carried out at various timings such as during startup, during normal operation, and during a stop of the power conversion device. It is thus possible to replace the degraded capacitor quickly at appropriate timing, to thereby achieve stable operation of the power conversion device.

Other Embodiments

The configuration illustrated as the embodiment described above is an example configuration of the present invention, and can be combined with other known techniques, or can be configured in a varied manner such as being partially omitted, within the range not departing from the subject matter of the present invention.

In addition, in the embodiment described above, processes and configurations described in other embodiments may be employed as appropriate for implementation.

It should be construed that the embodiments disclosed herein are given by way of illustration in all respects, not by way of limitation. It is intended that the scope of the present invention is defined by claims, not by the description above, and encompasses all modifications and variations equivalent in meaning and scope to the claims.

REFERENCE SIGNS LIST 1, 1A power conversion device; 2 power conversion circuitry; 3 controller; 4u, 4v, 4w leg circuit; 5 upper arm; 6 lower arm; 7 submodule; 8A, 8B reactor; 9A, 9B arm current detector; 10 AC voltage detector; 11A, 11B DC voltage detector; 12 AC circuit; 13 interconnection transformer; 14 DC circuit; 16 AC current detector; 17 signal; 20HB conversion circuit; 21 gate controller; 22A, 22B switching element; 23A, 23B diode; 24 DC capacitor; 26N, 26P input/output terminal; 27 voltage detector; 28 transmitter/receiver; 30 limitation circuit; 31 limitation resistor; 32 switch; 110 signal reception unit; 120 converter control unit; 130 time calculation unit; 140 change rate calculation unit; 150 ripple calculation unit; 160 determination unit; 170 output control unit.

The invention claimed is:

1. A power conversion device configured to perform power conversion between a DC circuit and an AC circuit, the power conversion device comprising:
   power conversion circuitry including a plurality of submodules connected in series to each other,
      each of the submodules including a capacitor;
   a signal reception unit configured to receive a signal representing a voltage of the capacitor in each of the submodules;
   a time calculation unit configured to calculate, during startup of the power conversion device, a charging time of the capacitor during initial charging based on the signal, and to calculate, during a stop of the power conversion device, a discharging time of the capacitor based on the signal; and
   a determination unit configured to determine whether the capacitor has degraded or not during the startup of the power conversion device based on a first result of comparison of the charging time calculated by the time calculation unit with a reference charging time serving as a reference for determining degradation of the capacitor, and to determine whether the capacitor has degraded or not during the stop of the power conversion device based on a second result of comparison of the discharging time calculated by the time calculation unit with a reference discharging time serving as a reference for determining degradation of the capacitor.

2. The power conversion device according to claim 1, wherein
   the determination unit is configured to determine that the capacitor has degraded during the startup of the power conversion device when a condition that the calculated charging time is less than the reference charging time is satisfied.

3. The power conversion device according to claim 2, wherein
   the power conversion circuitry is connected to a limitation circuit configured to limit a current flowing between the AC circuit and the power conversion circuitry,
   the limitation circuit includes a limitation resistor, and a switch connected in parallel with the limitation resistor, and
   the power conversion device further comprises a switch control unit configured to control the switch to be in an open state before start of charging of the capacitor.

4. The power conversion device according to claim 1, further comprising a change rate calculation unit configured to calculate, based on the signal, a first voltage change rate of the capacitor in a charging period of the capacitor, wherein
   the determination unit is configured to determine that the capacitor has degraded during the startup of the power conversion device when at least one of a condition that the calculated charging time is less than the reference charging time and a condition that the calculated first voltage change rate is greater than or equal to a first reference voltage change rate is satisfied.

5. The power conversion device according to claim 4, wherein
   the reference charging time is set based on a charging time of a capacitor that has not degraded, and
   the first reference voltage change rate is set based on a voltage change rate in a charging period of a capacitor that has not degraded.

6. The power conversion device according to claim 5, wherein
   the power conversion circuitry is connected to a limitation circuit configured to limit a current flowing between the AC circuit and the power conversion circuitry,
   the limitation circuit includes a limitation resistor, and a switch connected in parallel with the limitation resistor, and
   the power conversion device further comprises a switch control unit configured to control the switch to be in an open state before start of charging of the capacitor.

7. The power conversion device according to claim 4, wherein
   the reference charging time is set based on history information on the charging time of the capacitor, and
   the first reference voltage change rate is set based on history information on the first voltage change rate in the charging period of the capacitor.

8. The power conversion device according to claim 7, wherein
   the power conversion circuitry is connected to a limitation circuit configured to limit a current flowing between the AC circuit and the power conversion circuitry,
   the limitation circuit includes a limitation resistor, and a switch connected in parallel with the limitation resistor, and
   the power conversion device further comprises a switch control unit configured to control the switch to be in an open state before start of charging of the capacitor.

9. The power conversion device according to claim 4, wherein
   the power conversion circuitry is connected to a limitation circuit configured to limit a current flowing between the AC circuit and the power conversion circuitry,
   the limitation circuit includes a limitation resistor, and a switch connected in parallel with the limitation resistor, and
   the power conversion device further comprises a switch control unit configured to control the switch to be in an open state before start of charging of the capacitor.

10. The power conversion device according to claim 1, wherein
    the power conversion circuitry is connected to a limitation circuit configured to limit a current flowing between the AC circuit and the power conversion circuitry,
    the limitation circuit includes a limitation resistor, and a switch connected in parallel with the limitation resistor, and
    the power conversion device further comprises a switch control unit configured to control the switch to be in an open state before start of charging of the capacitor.

11. The power conversion device according to claim 1, further comprising
    a ripple calculation unit configured to calculate, during normal operation of the power conversion device, a ripple rate of the voltage of the capacitor based on the signal, wherein the determination unit is further configured to determine whether the capacitor has degraded or not during the normal operation of the power conversion device based on the calculated ripple rate and a reference ripple rate serving as a reference for determining degradation of the capacitor.

12. A power conversion device configured to perform power conversion between a DC circuit and an AC circuit, the power conversion device comprising:
   power conversion circuitry including a plurality of submodules connected in series to each other,
      each of the submodules including a capacitor;
   a signal reception unit configured to receive a signal representing a voltage of the capacitor in each of the submodules;
   a time calculation unit configured to calculate a charging time of the capacitor and a discharging time of the capacitor based on the signal; and
   a determination unit configured to determine whether the capacitor has degraded or not based on a first result of comparison of the charging time calculated by the time calculation unit with a reference charging time serving as a reference for determining degradation of the capacitor, and a second result of comparison of the discharging time calculated by the time calculation unit with a reference discharging time serving as a reference for determining degradation of the capacitor,
   the charging time including a time during which the capacitor is charged with a current flowing through the plurality of submodules, and
   the discharging time including a time during which the capacitor discharges the current flowing through the plurality of submodules.

13. The power conversion device according to claim 12, wherein
   the charging time includes a time during which the capacitor is charged with a current flowing through the plurality of submodules and a reactor connected in series to the plurality of submodules, and
   the discharging time includes a time during which the capacitor discharges the current flowing through the plurality of submodules and the reactor.

* * * * *